US 9,093,895 B2

(12) United States Patent
Hu et al.

(10) Patent No.: US 9,093,895 B2
(45) Date of Patent: Jul. 28, 2015

(54) MULTI-POWER DOMAIN OPERATIONAL AMPLIFIER AND VOLTAGE GENERATOR USING THE SAME

(75) Inventors: Min-Hung Hu, Hsinchu (TW); Chiu-Huang Huang, Hsinchu County (TW); Chen-Tsung Wu, Kaohsiung (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 293 days.

(21) Appl. No.: 13/557,415

(22) Filed: Jul. 25, 2012

(65) Prior Publication Data
US 2013/0221942 A1 Aug. 29, 2013

(30) Foreign Application Priority Data
Feb. 24, 2012 (TW) .............................. 101106411 A

(51) Int. Cl.
*H03F 3/45* (2006.01)
*H02M 1/08* (2006.01)
*H02M 1/00* (2007.01)

(52) U.S. Cl.
CPC ............ *H02M 1/08* (2013.01); *H03F 3/45183* (2013.01); *H03F 3/45192* (2013.01); *H02M 2001/0003* (2013.01); *H03F 2203/45674* (2013.01)

(58) Field of Classification Search
CPC ....................................................... H03F 3/45
USPC ........................................ 330/257, 253, 261
See application file for complete search history.

(56) References Cited

U.S. PATENT DOCUMENTS

| | | | | |
|---|---|---|---|---|
| 5,581,212 A | * | 12/1996 | Huang et al. | ........... 330/253 |
| 6,833,760 B1 | | 12/2004 | Aude | |
| 7,663,439 B2 | * | 2/2010 | Chang | ........... 330/255 |
| 7,956,690 B2 | * | 6/2011 | Nakao | ........... 330/255 |
| 8,159,302 B2 | * | 4/2012 | Yeh et al. | ........... 330/257 |
| 8,625,014 B2 | * | 1/2014 | Yoo et al. | ........... 348/300 |
| 8,638,164 B2 | * | 1/2014 | Son et al. | ........... 330/9 |

OTHER PUBLICATIONS

Taiwanese Office Action dated Jan. 16, 2015.

* cited by examiner

*Primary Examiner* — Henry Choe
(74) *Attorney, Agent, or Firm* — Rabin & Berdo, P.C.

(57) ABSTRACT

A multi-power domain operational amplifier includes an input stage circuit, a power domain transforming circuit and an active load. The input stage circuit is configured to transform a set of input voltages into a set of input currents in a first power domain. The power domain transforming circuit is configured to transform the set of input currents into a set of output currents in a second power domain. The active load is configured to generate an output voltage according to the set of output currents. A common mode range of the output voltage is shifted as compared with a common mode range of the set of input voltages.

11 Claims, 5 Drawing Sheets

MULTI-POWER DOMAIN OPERATIONAL AMPLIFIER AND VOLTAGE GENERATOR USING THE SAME

This application claims the benefit of Taiwan application Serial No. 101106411, filed Feb. 24, 2012, the subject matter of which is incorporated herein by reference.

BACKGROUND OF THE INVENTION

1. Field of the Invention

The invention relates to a multi-power domain operational amplifier and a voltage generator using the same.

2. Description of the Related Art

Because of the properties of semiconductor elements, many applications need a set of a positive reference voltage and a negative reference voltage, which are not affected by the temperature and are about +5 volts and −5 volts, respectively. The +5 volts and −5 volts approach the voltage withstanding upper bound (6 volts) of the medium voltage element. In the industry, a bandgap reference circuit is typically utilized to generate a zero temperature coefficient reference voltage of about 1.2 volts, and boost and buck operations are performed through a regulator based on the zero temperature coefficient reference voltage. Thus, various reference voltages for various applications can be generated.

FIG. 1 is a circuit diagram showing an example of a conventional voltage generator 10. Referring to FIG. 1, the voltage generator 10 includes a unity gain buffer 12, a first regulator 14 and a second regulator 16. In FIG. 1, the operation voltage VDD is equal to 3 volts, for example, and the zero temperature coefficient reference voltage $V_{ref}$ generated by the bandgap reference circuit is equal to 1.2 volts, for example. Boost and buck operations may be performed on the zero temperature coefficient reference voltage $V_{ref}$ by utilizing the first regulator 14 and the second regulator 16 according to the resistance relationship: (R1+R2)/R1=5/1.2 so that the positive reference voltage $V_{outP}$=5 volts and the negative reference voltage $V_{outN}$=−5 volts can be obtained. Because the second regulator 16 takes the ground voltage (0 volts) as the reference point, the power domain of its internal operational transductance amplifier (OTA) 18 needs to range from VDD to −2 VDD (i.e., from 3 volts to −6 volts), which exceeds the voltage withstanding restriction of the medium voltage element. So, the high voltage element has to be adopted. Consequently, the poor element property of the high voltage element reduces the overall circuit behavior, and occupies a lot of layout area.

FIG. 2 is a circuit diagram showing another example of a conventional voltage generator 20. Referring to FIG. 2, the voltage generator 20 includes a unity gain buffer 22, a first regulator 24, a second regulator 26 and a third regulator 28. In FIG. 2, the operation voltage VDD is equal to 3 volts, for example, and the zero temperature coefficient reference voltage $V_{ref}$ generated by the bandgap reference circuit is equal to 1.2 volts, for example. The zero temperature coefficient reference voltage $V_{ref}$ utilizes the first regulator 24 to perform a boosting operation according to the resistance relationship and thus obtain the positive reference voltage $V_{outP}$=5 volts. In addition, the zero temperature coefficient reference voltage $V_{ref}$ utilizes the second regulator 26 to perform a bucking operation with the ground voltage (0 volts) serving as the reference point to obtain −$V_{ref}$=−1.2 volts first, and then utilizes the third regulator 28 to perform two bucking operations to obtain the negative reference voltage $V_{outN}$=−5 volts. With the cascaded two stages of regulator structures 26 and 28, the power domain of the second regulator 26 ranges from VDD to −VDD (i.e., from 3 volts to −3 volts), and the power domain of the third regulator 28 ranges from GND to −2 VDD (i.e., from 0 volts to −6 volts), wherein the power domains are kept within the voltage withstanding range of the medium voltage element and the use of the high voltage element can be avoided. In the structure of the voltage generator 20, however, an additional stage of regulators may make the output voltage have an offset and be affected by the power noise.

In addition, in the process of transforming the positive voltage into the negative voltage, the voltage generators 10 and 20 need to use the unity gain buffers 12 and 22, respectively, so that the zero temperature coefficient reference voltage $V_{ref}$ possesses the driving ability to provide the current output. However, using the unity gain buffers 12 and 22 increases the circuit complexity and the layout area, and also increases the offset of the output voltage and the influence of the power noise.

SUMMARY OF THE INVENTION

The disclosure is directed to a multi-power domain operational amplifier and a voltage generator using the same. The transformation of the power domain of the multi-power domain operational amplifier enables the voltage generator to generate the required positive reference voltage and negative reference voltage without using the high voltage element.

According to a first aspect of the disclosure, a multi-power domain operational amplifier including an input stage circuit, a power domain transforming circuit and an active load is provided. The input stage circuit is configured to transform a set of input voltages into a set of input currents in a first power domain. The power domain transforming circuit is configured to transform the set of input currents into a set of output currents in a second power domain different from the first power domain. The active load is configured to generate an output voltage according to the set of output currents, wherein a common mode range of the output voltage is shifted as compared with a common mode range of the set of input voltages.

According to a second aspect of the disclosure, a voltage generator including a cascade resistor, a first regulator and a second regulator is provided. The cascade resistor has a first feedback terminal and a second feedback terminal. The first regulator is configured to output a first output voltage, and includes a multi-power domain operational amplifier having a negative feedback configuration. The multi-power domain operational amplifier operates in a first power domain and a second power domain different from the first power domain and has an inverting input terminal receiving a first reference voltage, and a noninverting input terminal coupled to the first feedback terminal. The second regulator is configured to output a second output voltage and includes a single power domain operational amplifier operating in a third power domain and having the negative feedback configuration. The single power domain operational amplifier has an inverting input terminal receiving a second reference voltage, and a noninverting input terminal coupled to the second feedback terminal.

The above and other aspects of the invention will become better understood with regard to the following detailed description of the preferred but non-limiting embodiment(s). The following description is made with reference to the accompanying drawings.

DETAILED DESCRIPTION OF THE INVENTION

This disclosure provides a multi-power domain operational amplifier and a voltage generator using the same. The transformation of the power domain regulates the common mode range of the multi-power domain operational amplifier, so that the voltage generator can generate the required positive reference voltage and negative reference voltage without using high voltage elements. Words utilized for describing connection between two components such as "couple" and "connect" should not be taken as limiting a connection between the two components to directly coupling or indirectly coupling.

Figure 1:
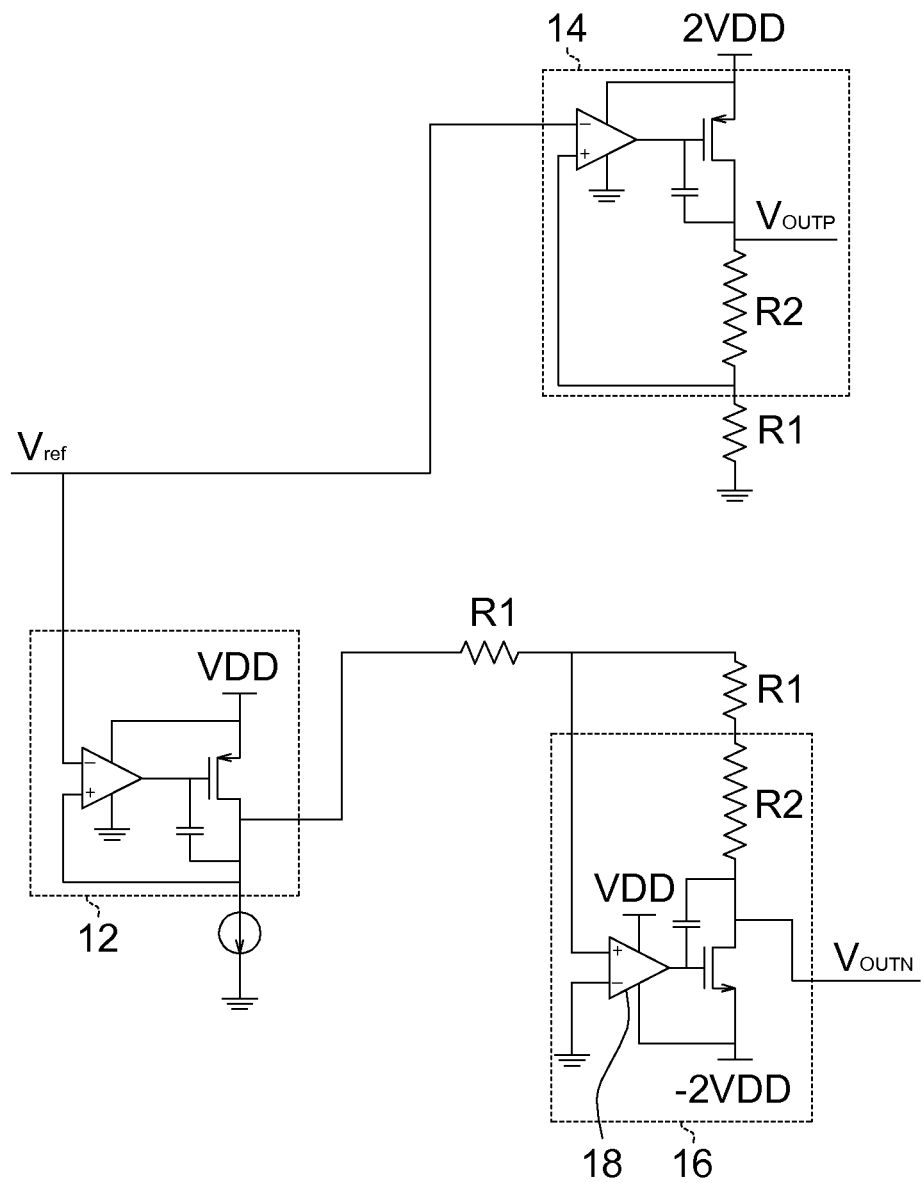
FIG. 1 is a circuit diagram showing an example of a conventional voltage generator.
Figure 2:
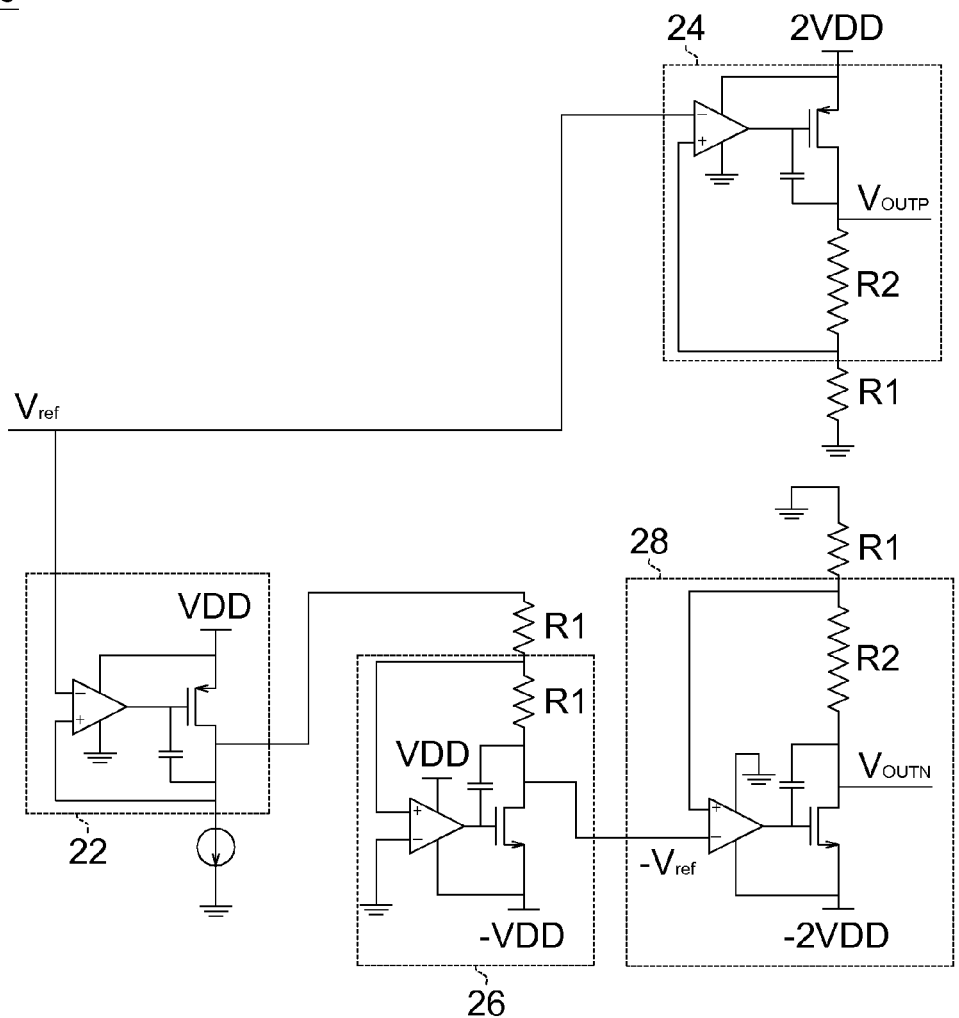
FIG. 2 is a circuit diagram showing another example of a conventional voltage generator.
Figure 3:
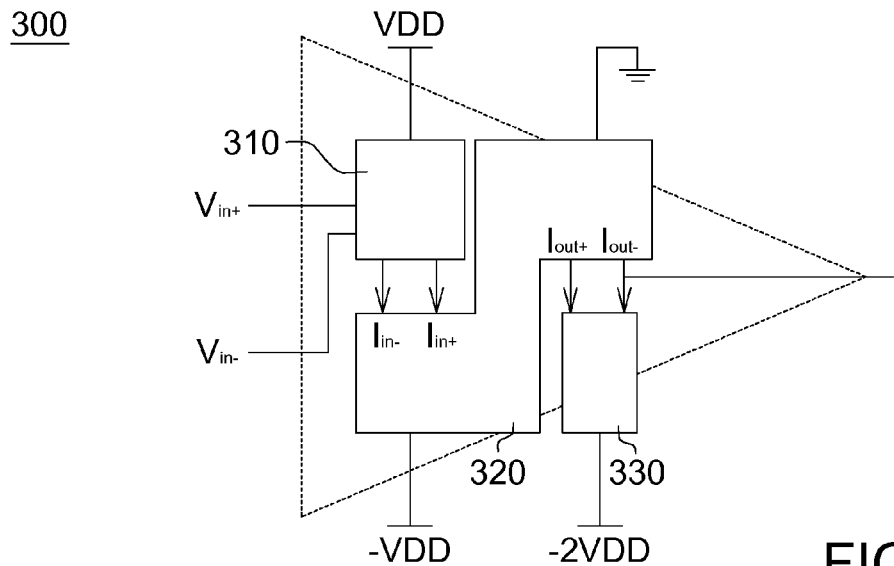
FIG. 3 is a schematic illustration showing a multi-power domain operational amplifier according to an embodiment.

FIG. 3 is a schematic illustration showing a multi-power domain operational amplifier 300 according to an embodiment. Referring to FIG. 3, the multi-power domain operational amplifier 300 includes an input stage circuit 310, a power domain transforming circuit 320 and an active load 330. The input stage circuit 310 is coupled to a first voltage source VDD, which may be composed of a single PMOS input pair and a single NMOS input pair or composed of a PMOS input pair and an NMOS input pair. The input stage circuit 310 is configured to transform a set of input voltages ($V_{in+}$, $V_{in-}$) into a set of input currents ($I_{in+}$, $I_{in-}$) in a first power domain. The first power domain ranges between the first voltage source and the second voltage source. In this example, the first voltage source is VDD while the second voltage source is −VDD. That is, the first power domain is (from VDD to −VDD). Specifically, the first voltage source VDD is 3 volts, while the second voltage source −VDD is −3 volts, for example.

The power domain transforming circuit 320 includes a first current buffer and a second current buffer. The first current buffer is coupled between the input stage circuit 310 and the second voltage source −VDD, and is configured to transform the set of input currents ($I_{in+}$, $I_{in-}$) into a set of relay currents in a relay power domain. The first relay power domain ranges between the second voltage source and the third voltage source (e.g., GND). In this example, the first relay power domain is (−VDD to GND). The second current buffer is coupled between the first current buffer and the third voltage source GND, and is configured to generate a set of output currents ($I_{out+}$, $I_{out-}$) in a second power domain according to the set of relay currents. The second power domain ranges between the third voltage source and a fourth voltage source (e.g., −2 VDD). In this example, the second power domain is (GND to −2 VDD) (more specifically, from 0 volts to −6 volts).

The active load 330 may be composed of a current mirror or a current source, is coupled between the second current buffer and the fourth voltage source −2 VDD, and is configured to generate an output voltage $V_{out}$ according to the set of output currents ($I_{out+}$, $I_{out-}$). A common mode range (from GND to −2 VDD) of the output voltage $V_{out}$ is shifted as compared with a common mode range (from VDD to −VDD) of the set of input voltages ($V_{in+}$, $V_{in-}$).

Figure 4:
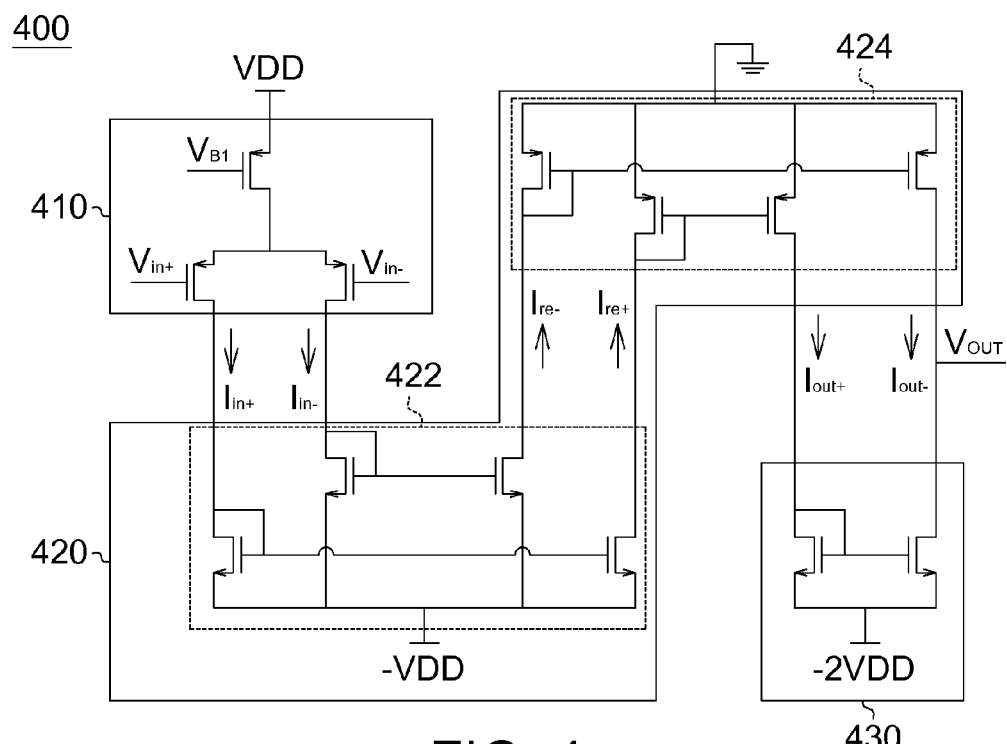
FIG. 4 is a circuit diagram showing a multi-power domain operational amplifier according to an embodiment.

FIG. 4 is a circuit diagram showing a multi-power domain operational amplifier 400 according to an embodiment. Referring to FIG. 4, the multi-power domain operational amplifier 400 includes an input stage circuit 410, a power domain transforming circuit 420 and an active load 430. The input stage circuit 410 may be composed of a PMOS input pair, and is coupled to the first voltage source VDD. The input stage circuit 410 transforms the input voltages ($V_{in+}$, $V_{in-}$) into the input currents ($I_{in+}$, $I_{in-}$). In the example of FIG. 4, the power domain transforming circuit 420 is a current mirror circuit. The current mirror circuit 420 has a first current mirror 422 and a second current mirror 424 implementing the first current buffer and the second current buffer, respectively.

The first current mirror 422 is coupled between the input stage circuit 410 and the second voltage source −VDD, and is configured to transform the input currents ($I_{in+}$, $I_{in-}$) into the relay currents ($I_{re+}$, $I_{re-}$). The second current mirror 424 is coupled between the first current mirror 422 and the third voltage source GND, and is configured to provide the output currents ($I_{out+}$, $I_{out-}$) to the active load 430 according to the third voltage source GND serving as the reference point so that the output voltage $V_{out}$ is generated. The active load 430 is coupled between the second current mirror 424 and the fourth voltage source −2 VDD. Because the common mode range of the output voltage $V_{out}$ is shifted as compared with the common mode range of the input voltages ($V_{in+}$, $V_{in-}$), the voltage from GND to −2VDD (e.g., from 0 volts to −6 volts) can be outputted with the GND=0 volts serving as the reference point without using the high voltage element.

Figure 5:
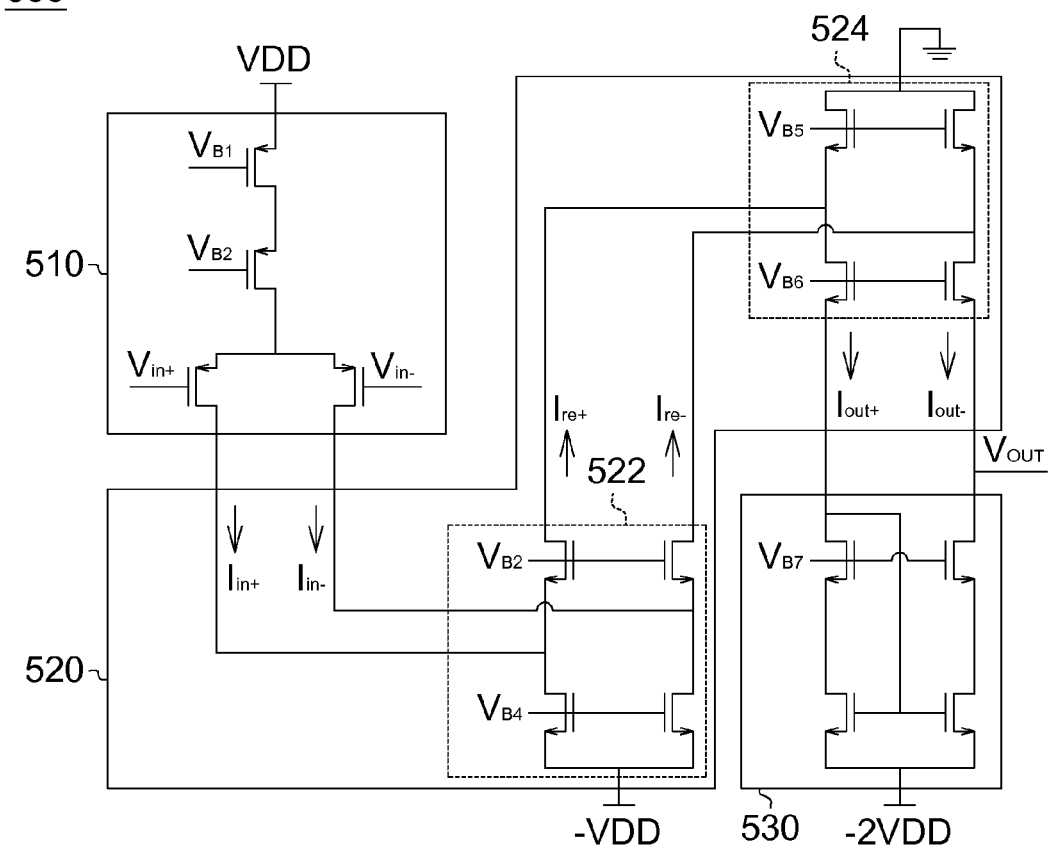
FIG. 5 is a circuit diagram showing a multi-power domain operational amplifier according to another embodiment.

FIG. 5 is a circuit diagram showing a multi-power domain operational amplifier 500 according to another embodiment. Referring to FIG. 5, the multi-power domain operational amplifier 500 includes an input stage circuit 510, a power domain transforming circuit 520 and an active load 530. The input stage circuit 510 is composed of a PMOS input pair coupled to the first voltage source VDD. The input stage circuit 510 transforms the input voltages ($V_{in+}$, $V_{in-}$) into the input currents ($I_{in+}$, $I_{in-}$). In the example of FIG. 5 to be described, the power domain transforming circuit 520 is a folded-cascode circuit, which has a first folded-cascode 522 and a second folded-cascode 524 for implementing the first current buffer and the second current buffer, respectively.

The first folded-cascode 522 is coupled between the input stage circuit 510 and the second voltage source −VDD, and is configured to transform the input currents ($I_{in+}$, $I_{in-}$) into the relay currents ($I_{re+}$, $I_{re-}$). The second folded-cascode 524 is coupled between the first folded-cascode 522 and the third voltage source GND, and is configured to provide the output currents ($I_{out+}$, $I_{out-}$) to the active load 530 according to the third voltage source GND serving as the reference point, so that the output voltage $V_{out}$ is generated. The active load 530 is coupled between the second folded-cascode 524 and the fourth voltage source −2VDD. Because the common mode range of the output voltage $V_{out}$ is shifted as compared with the common mode range of the input voltages ($V_{in+}$, $V_{in-}$), the voltage from GND to −2VDD (e.g., from 0 volts to −6 volts) can be outputted with the GND=0 volts serving as the reference point without using the high voltage element. In addition, because the multi-power domain operational amplifier 500 utilizes the folded cascode structure to receive and output the currents, it has the better linear voltage regulating and noise-resisting ability, and can provide the higher input common mode range and output common mode range under the same power.

Although two current buffers are described as the example of the power domain transforming circuit 420/520, the invention is not restricted thereto. The power domain transforming circuit 420/520 may further include one to many third cascading current buffers, which are coupled between the first current buffer and the second current buffer and configured to generate the other one to many sets of relay currents according to the relay currents ($I_{re+}$, $I_{re-}$) from the first current buffer or according to the relay currents from a previous stage of the cascading current buffers, and provide one of the other one to many sets of relay currents to the second current buffer or to a next stage of the cascading current buffers. The other one to many sets of relay currents have different power domains.

Figure 6:
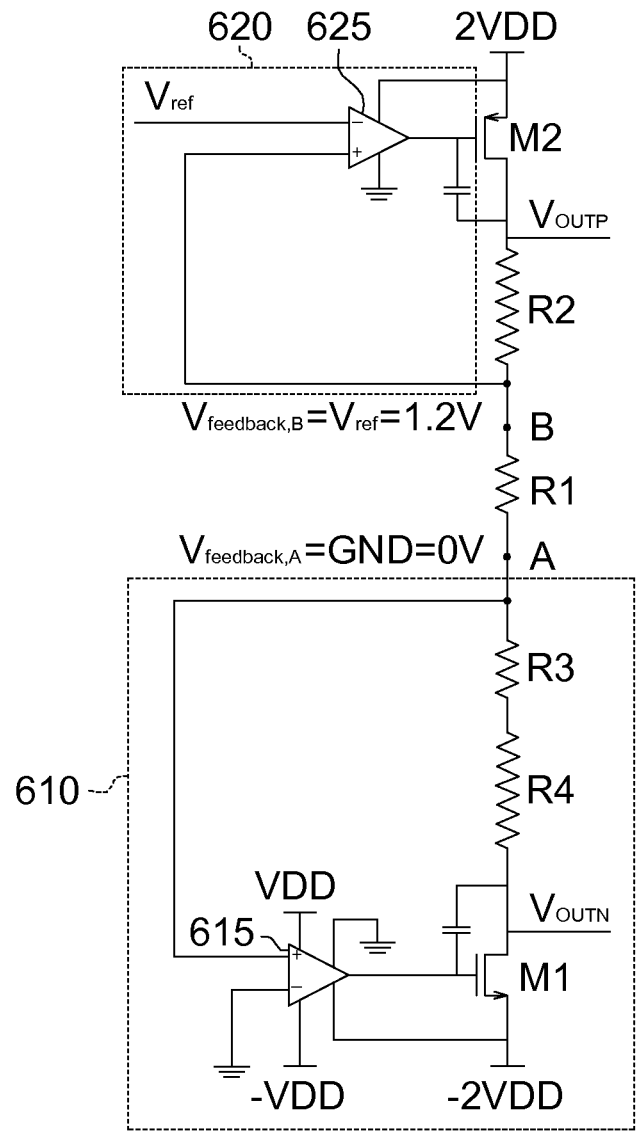
FIG. 6 is a circuit diagram showing a voltage generator according to an embodiment.

FIG. 6 is a circuit diagram showing a voltage generator 600 according to an embodiment. Referring to FIG. 6, the voltage generator 600 includes a cascade resistor R1, a first regulator 610 and a second regulator 620. The cascade resistor R1 has a first feedback terminal (node A) and a second feedback terminal (node B). The first regulator 610 is configured to output a first output voltage $V_{outN}$. The first regulator 610 includes a multi-power domain operational amplifier 615 with a negative feedback configuration, resistors R3 and R4 serially connected together and a transistor M1, wherein R3=R1 and R4=R2. The first terminal of the resistor R3 is coupled to the first feedback terminal (node A). The transistor M1 has a first terminal coupled to the voltage source −2VDD, a second terminal coupled to the second terminal of the resistor R4 and a control terminal coupled to an output terminal of the multi-power domain operational amplifier 615.

The actual circuit architecture of the multi-power domain operational amplifier 615 may be shown in the multi-power domain operational amplifier 300/400/500. The multi-power domain operational amplifier 615 is coupled between a first voltage source VDD and a second voltage source −VDD, and is coupled between a third voltage source GND and a fourth voltage source −2VDD. The multi-power domain operational amplifier 615 operates in a first power domain (from VDD to −VDD) and a second power domain (from GND to −2VDD). The multi-power domain operational amplifier 615 has an inverting input terminal receiving a first reference voltage GND, and a noninverting input terminal coupled to the first feedback terminal (node A). Consequently, the first feedback terminal (node A) is regulated at the first reference voltage GND.

Because the first regulator 610 utilizes the multi-power domain operational amplifier 615, the voltage from GND to −2VDD (i.e., from 0 volts to −6 volts) can be generated with the first reference voltage GND serving as the reference point without using the high voltage element.

The second regulator 620 is configured to output a second output voltage $V_{outP}$. The second regulator 620 includes a single power domain operational amplifier 625 operating in a third power domain (from 2 VDD to GND) and having a negative feedback configuration, a resistor R2 and a transistor M2. The first terminal of the resistor R2 is coupled to the second feedback terminal (node B). The transistor M2 has a first terminal coupled to the voltage source 2 VDD, a second terminal coupled to the second terminal of the resistor R2, and a control terminal coupled to an output terminal of the single power domain operational amplifier 625. The single power domain operational amplifier 625 is coupled between a fifth voltage source 2 VDD and the third voltage source GND. The single power domain operational amplifier 625 has an inverting input terminal receiving a second reference voltage $V_{ref}$,
and a noninverting input terminal coupled to the second feedback terminal (node B). Consequently, the second feedback terminal (node B) is regulated at the second reference voltage $V_{ref}$.

The first regulator 610 and the second regulator 620 can be merged by providing the current from the second feedback terminal (node B) coupled to the second regulator 620 to the first feedback terminal (node A) coupled to the first regulator 610. Consequently, the required DC current flowing through the resistors R2, R3 and R4 is generated on the resistor R1 according to $V_{feedback,B} = V_{ref} = 1.2$ volts and $V_{feedback,A} = GND = 0$ volts, so that the first output voltage $V_{outN} = -5$ volts and the second output voltage $V_{outP} = 5$ volts can be obtained.

In the multi-power domain operational amplifier of the embodiment and the voltage generator using the same, the common mode range of the multi-power domain operational amplifier can be regulated via the power domain transformation of the multi-power domain operational amplifier, so that the voltage generator can generate the required positive reference voltage and negative reference voltage utilizing a small number of regulators without using the high voltage element. Consequently, the circuit design complexity can be simplified, the layout area can be reduced, the voltage offset caused by the element mismatch can be significantly decreased, and the power noise generated through the power transistor can be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-power domain operational amplifier, comprising:
    an input stage circuit configured to transform a set of input voltages into a set of input currents in a first power domain;
    a power domain transforming circuit configured to transform the set of input currents into a set of output currents in a second power domain different from the first power domain; and
    an active load configured to generate an output voltage according to the set of output currents,
    wherein a common mode range of the output voltage is shifted as compared with a common mode range of the set of input voltages; and
    wherein the power domain transforming circuit comprises cascading current buffers each involving a different power domain.

2. The operational amplifier according to claim 1, wherein the cascading current buffers of the power domain transforming circuit comprise:
    a first current buffer configured to transform the set of input currents into a set of first relay currents in a first relay power domain different from the first power domain; and
    a second current buffer configured to generate the set of output currents according to the set of first relay currents.

3. The operational amplifier according to claim 2, wherein the input stage circuit is coupled to a first voltage source, the first current buffer is coupled between the input stage circuit and a second voltage source, the second current buffer is coupled between the first current buffer and a third voltage source, and the active load is coupled between the second current buffer and a fourth voltage source.

4. The operational amplifier according to claim 2, wherein the cascading current buffers of the power domain transforming circuit further comprise:
at least one third current buffer, which is coupled between the first current buffer and the second current buffer, and is configured to generate at least one set of second relay currents according to the set of first relay currents in a second relay power domain different from the first power domain and the first relay power domain, and to provide one of the at least one set of second relay currents to the second current buffer.

5. The operational amplifier according to claim 1, wherein the input stage circuit utilizes a PMOS input pair or an NMOS input pair to transform the set of input voltages into the set of input currents.

6. The operational amplifier according to claim 1, wherein the input stage circuit utilizes a PMOS input pair and an NMOS input pair to transform the set of input voltages into the set of input currents.

7. The operational amplifier according to claim 1, wherein the power domain transforming circuit is a current mirror circuit.

8. The operational amplifier according to claim 7, wherein the input stage circuit is coupled to a first voltage source, the current mirror circuit has a first current mirror coupled between the input stage circuit and a second voltage source, and a second current mirror coupled between the first current mirror and a third voltage source, and the active load is coupled between the second current mirror and a fourth voltage source.

9. The operational amplifier according to claim 1, wherein the power domain transforming circuit is a folded-cascode circuit.

10. The operational amplifier according to claim 9, wherein the input stage circuit is coupled to a first voltage source, the folded-cascode circuit has a first folded-cascode coupled between the input stage circuit and a second voltage source, and a second folded-cascode coupled between the first folded-cascode and a third voltage source, and the active load is coupled between the second folded-cascode and a fourth voltage source.

11. The operational amplifier according to claim 1, wherein the active load is composed of a current mirror or a current source.

* * * * *